(12) United States Patent
Hu

(10) Patent No.: US 11,010,065 B2
(45) Date of Patent: May 18, 2021

(54) READ RETRY METHOD FOR SOLID STATE STORAGE DEVICE

(71) Applicants: Lite-On Electronics (Guangzhou) Limited, Guangzhou (CN); LITE-ON TECHNOLOGY CORPORATION, Taipei (TW)

(72) Inventor: Chih-Yuan Hu, Taipei (TW)

(73) Assignee: SOLID STATE STORAGE TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 16/265,488

(22) Filed: Feb. 1, 2019

(65) Prior Publication Data

US 2020/0135280 A1     Apr. 30, 2020

(30) Foreign Application Priority Data

Oct. 29, 2018  (CN) .......................... 201811273012.6

(51) Int. Cl.

| | |
|---|---|
| G11C 16/26 | (2006.01) |
| G06F 3/06 | (2006.01) |
| G11C 29/52 | (2006.01) |
| G11C 16/34 | (2006.01) |
| G06F 11/10 | (2006.01) |
| G11C 11/56 | (2006.01) |
| G11C 16/04 | (2006.01) |

(52) U.S. Cl.
CPC ............ *G06F 3/0619* (2013.01); *G06F 3/064* (2013.01); *G06F 3/0659* (2013.01); *G06F 3/0679* (2013.01); *G06F 11/1068* (2013.01); *G11C 16/26* (2013.01); *G11C 16/3495* (2013.01); *G11C 29/52* (2013.01); *G11C 11/5642* (2013.01); *G11C 16/0483* (2013.01)

(58) Field of Classification Search
CPC ..... G11C 16/26; G11C 16/3495; G11C 29/52; G11C 11/5642; G11C 16/0483; G11C 16/349–3495; G11C 16/3418; G11C 16/3459; G11C 11/1521; G06F 3/0619; G06F 3/064; G06F 3/0659; G06F 3/0679; G06F 11/1068

See application file for complete search history.

(56) References Cited

U.S. PATENT DOCUMENTS 9,514,848 B2 * 12/2016 Wu ..................... G11C 11/5642
9,640,281 B1 * 5/2017 Seo ........................ G06F 3/0604
(Continued)

*Primary Examiner* — Reginald G Bragdon
*Assistant Examiner* — Curtis James Kortman
(74) *Attorney, Agent, or Firm* — WPAT, PC

(57) ABSTRACT

A read retry method for a solid state storage device is provided. The solid state storage device is in communication with a host. The solid state storage device includes a non-volatile memory. The read retry method includes the following steps. Firstly, the solid state storage device judges whether a specified read block of the non-volatile memory is in a specified failure mode. If the specified read block of the non-volatile memory is in the specified failure mode, a failure mode read retry process corresponding to the specified failure mode is performed. If an accurate read data is acquired in the failure mode read retry process, the accurate read data is transmitted to the host. If the accurate read data is not acquired in the failure mode read retry process, a read fail message is sent to the host.

5 Claims, 10 Drawing Sheets

(56) References Cited

U.S. PATENT DOCUMENTS

| | | | |
|---|---|---|---|
| 10,114,694 B2* | 10/2018 | Lee | G06F 3/064 |
| 10,606,518 B2* | 3/2020 | Zeng | G11C 16/26 |
| 2013/0016562 A1* | 1/2013 | Mun | G11C 16/3454 |
| | | | 365/185.12 |
| 2016/0266970 A1* | 9/2016 | Amaki | G06F 3/0679 |
| 2017/0345489 A1* | 11/2017 | Zeng | G11C 16/0483 |
| 2018/0342297 A1* | 11/2018 | Kim | G11C 11/5628 |
| 2019/0361778 A1* | 11/2019 | Kim | G11B 20/10388 |

\* cited by examiner

Read table 136

| Default read voltage set | RSd |
|---|---|

136a

| Order | 1 | 2 | 3 | 4 | 5 | 6 | ... | n |
|---|---|---|---|---|---|---|---|---|
| Retry read voltage set | RSb1 | RSb2 | RSb3 | RSb4 | RSb5 | RSb6 | ... | RSbn |

136b

| Order | 1 | 2 | 3 | 4 | 5 | ... | m |
|---|---|---|---|---|---|---|---|
| Retry read voltage set | RSc1 | RSc2 | RSc3 | RSc4 | RSc5 | ... | RScm |

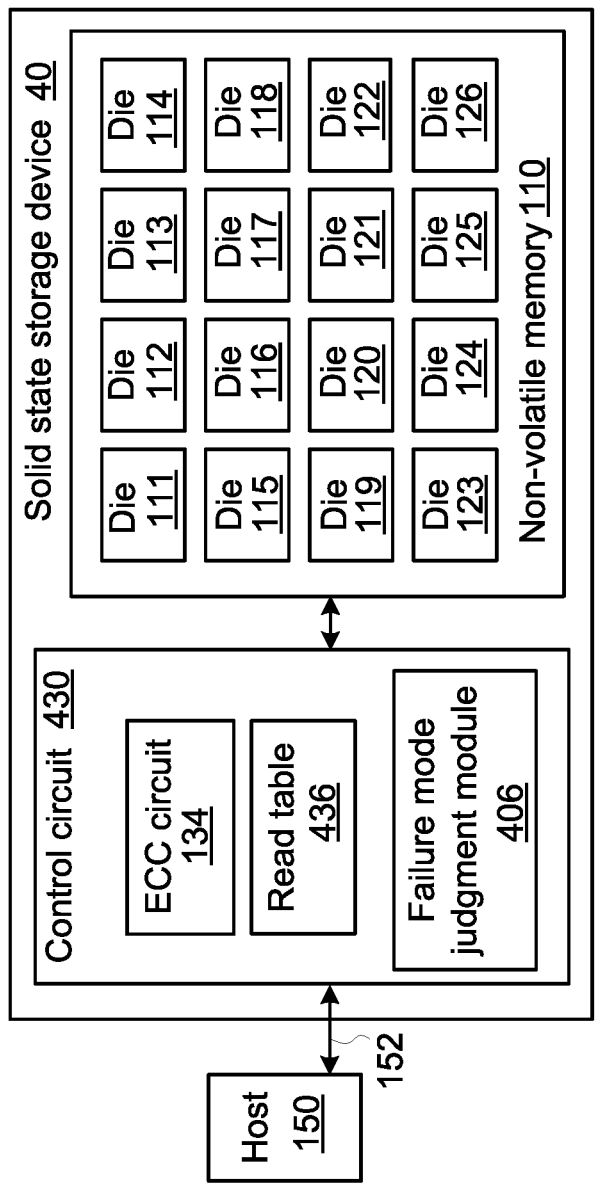

READ RETRY METHOD FOR SOLID STATE STORAGE DEVICE

This application claims the benefit of People's Republic of China Patent Application No. 201811273012.6, filed Oct. 29, 2018, the subject matter of which is incorporated herein by reference.

FIELD OF THE INVENTION

The present invention relates to a control method for a solid state storage device, and more particularly to a read retry method for a solid state storage device.

BACKGROUND OF THE INVENTION

As is well known, solid state storage devices (SSD) are widely used in various electronic devices such as SD cards, notebook computers, servers or data centers. Generally, a solid state storage device comprises a non-volatile memory. After data are written into the non-volatile memory, when no electric power is supplied to the solid state storage device, the data are still retained in the non-volatile memory.

FIG. 1A is a schematic functional block diagram illustrating the architecture of a conventional solid state storage device. As shown in FIG. 1A, the solid state storage device 10 comprises a control circuit 130 and a non-volatile memory 110. The control circuit 130 further comprises an error correction (ECC) circuit 134. The solid state storage device 10 further comprises a read table 136. As shown in FIG. 1A, the read table 136 is included in the control circuit 130. In some situations, the read table 136 is included in the non-volatile memory 110.

The solid state storage device 10 is connected with a host 150 through an external bus 152. For example, the external bus 152 is a USB bus, an SATA bus, a PCIe bus, an M.2 bus, a U.2 bus, or the like.

Moreover, the control circuit 130 is connected with the non-volatile memory 110. According to a write command from the host 150, the control circuit 130 stores the write data from the host 150 to the non-volatile memory 110. Alternatively, according to a read command from the host 150, the control circuit 130 acquires a read data from the non-volatile memory 110. In addition, the read data is transmitted to the host 150 through the control circuit 130.

The non-volatile memory 110 comprises plural dies 111~126. For example, the plural dies 111~126 are NAND flash dies. For increasing the data reliability, the plural dies 111~126 are combined as a redundant array of independent disk (RAID).

In the solid state storage device 10 with the RAID function, at least one die of the plural dies 111~126 is used for storing a parity data. For example, the last die 126 is used for storing a parity data. Moreover, the write data from the host 150 is divided into plural sub-write data by the control circuit 130, and the plural sub-write data are written into the dies 111~126. Moreover, the control circuit 130 generates a parity data corresponding to the plural sub-write data and writes the parity data into the last die 126.

For example, the non-volatile memory 110 comprises 16 dies 111~126, and the last die 126 is used for storing the parity data. The stripe size set in the solid state storage device 10 is 160 Kbytes. After the amount of the write data receives by the control circuit 130 reaches 150 Kbytes, the control circuit 130 performs a RAID operation on the 150 Kbyte write data and generates a 10 Kbyte parity data. In other words, the amount of the write data and the parity data is equal to the stripe size (i.e., 160 Kbytes). Consequently, the 150 Kbyte write data and the 10 Kbyte parity data are written into the corresponding dies 111~126.

According to a read command, the control circuit 130 acquires 15 sub-write data from the dies 111~125. If all of the 15 sub-write data are successfully decoded by the ECC circuit 134, the sub-write data are combined as a 150 Kbyte read data, and the 150 Kbyte read data is transmitted to the host 150. If one of the 15 sub-write data is not successfully decoded by the ECC circuit 134, the control circuit 130 selectively performs a RAID recovery operation to recover the data. That is, the control circuit 130 performs the RAID recovery operation on the other 14 sub-write data and the parity data to recover this sub-write data. Then, the recovered sub-write data and the other 14 sub-write data are combined as a 150 Kbyte read data, and the 150 Kbyte read data is transmitted to the host 150.

Moreover, each of the dies 111~126 comprises plural memory cells. All of the memory cells are combined as a memory cell array. The memory cell array is divided into plural blocks, and each block is divided into plural pages.

Depending on the data amount to be stored in the memory cell, the memory cells may be classified into four types, i.e. a single-level cell (SLC), a multi-level cell (MLC), a triple-level cell (TLC) and a quad-level cell (QLC). The SLC can store only one bit of data per cell. The MLC can store two bits of data per cell. The TLC can store three bits of data per cell. The QLC can store four bits of data per cell. In other words, the memory cell array in the non-volatile memory 110 is a SLC memory cell array, a MLC memory cell array, a TLC memory cell array or a QLC memory cell array.

FIG. 1B schematically illustrates the threshold voltage distribution curves of triple-level cells in different storing states. According to the number of injected hot carriers, the triple-level cell has eight storing states "Erase" and "A"~"G". Before the hot carriers are injected into the memory cell, the memory cell is in a storing state "Erase". As the number of the injected hot carriers increases, the memory cell is sequentially in the other seven storing states "A"~"G". For example, the memory cell in the storing state "G" has the highest threshold voltage, and the memory cell in the storing state "Erase" has the lowest threshold voltage. After an erase cycle, the memory cell is restored to the storing state "Erase", and no hot carriers are retained in the memory cell.

In practice, even if many memory cells are in the same storing state during the program cycle, the threshold voltages of these memory cells are not all identical. That is, the threshold voltages of these memory cells are distributed in a specified distribution curve with a median threshold voltage.

The median threshold voltage of the memory cells in the storing state "Erase" is Ver. The median threshold voltage of the memory cells in the storing state "A" is Va. The median threshold voltage of the memory cells in the storing state "B" is Vb. The median threshold voltage of the memory cells in the storing state "C" is Vc. The median threshold voltage of the memory cells in the storing state "D" is Vd. The median threshold voltage of the memory cells in the storing state "E" is Ve. The median threshold voltage of the memory cells in the storing state "F" is Vf. The median threshold voltage of the memory cells in the storing state "G" is Vg. For example, the median threshold voltage for a greater number of memory cells in the storing state "A" is Va.

Please refer to FIG. 1B again. According to the above characteristics of the triple-level cell, a default read voltage set including seven read voltages Vra~Vrg is defined. During the read cycle, the control circuit 130 provides the default read voltage set to the non-volatile memory 110 in order to detect the storing states of the triple-level cells of the memory cell array.

The storing states of the triple-level cells are determined according to the read voltages Vra~Vrg. For example, the read voltage Vrg is provided from the non-volatile memory 110 to the memory cell array. If the threshold voltage of the memory cell is higher than the read voltage Vrg and the memory cell is turned off, the memory cell is judged to be in the storing state "G". Whereas, if the threshold voltage of the memory cell is lower than the read voltage Vrg and the memory cell is turned on, the memory cell is not in the storing state "G". In other words, the eight storing states of the triple-level cells are determined according to the seven read voltages Vra~Vrg of the default read voltage set.

Similarly, four storing states of the multi-level cells are determined according to three read voltages of the default read voltage set. Similarly, two storing states of the single-level cells are determined according to one read voltage of the default read voltage set.

FIG. 10 schematically illustrates the shift of the threshold voltage distribution curves of triple-level cells in different storing states. In practice, the solid state storage device 10 is possibly in different operating conditions. For example, the solid state storage device 10 is in a program failure condition, a write/read temperature difference condition or a read disturbing condition. In the read disturbing condition, the pages in the same block are repeatedly read. If the read count is high enough (e.g., several ten thousand or more), the threshold voltage distribution curves of the memory cells in a specified page of the block are shifted or distorted. Moreover, if the data retention time of the memory cells is very long (e.g., over one month at 40° C.), the threshold voltage distribution curves are possibly shifted or distorted.

In the above operating conditions, the threshold voltage distribution curves of the memory cells in the memory cell array are possibly shifted or distorted. If the threshold voltage distribution curves are shifted or distorted very seriously, the ECC circuit 134 cannot successfully correct all error bits.

As shown in FIG. 10, the threshold voltage distribution curves of the triple-level cells are shifted or distorted. The median threshold voltage of the memory cells in the storing state "Erase" is Ver'. The median threshold voltage of the memory cells in the storing state "A" is Va'. The median threshold voltage of the memory cells in the storing state "B" is Vb'. The median threshold voltage of the memory cells in the storing state "C" is Vc'. The median threshold voltage of the memory cells in the storing state "D" is Vd'. The median threshold voltage of the memory cells in the storing state "E" is Ve'. The median threshold voltage of the memory cells in the storing state "F" is Vf'. The median threshold voltage of the memory cells in the storing state "G" is Vg'.

If the storing states of the triple-level cells are determined according to the read voltages Vra~Vrg of the default read voltage set, the number of error bits in the read data increases. Consequently, the ECC circuit 134 is unable to successfully correct all error bits of the read data, and the accurate read data cannot be transmitted to the host 150. Meanwhile, the control circuit 130 has to perform a read retry process.

FIG. 1D schematically illustrates the contents of a read table in the conventional solid state storage device. As shown in FIG. 1D, the read table 136 contains three sub-read tables 136a, 136b and 136c. A default read voltage set RSd is recorded in the sub-read table 136a, n retry read voltage sets RSb1~RSbn are recorded in the sub-read table 136b, and m retry read voltage sets RSc1~RScm are recorded in the sub-read table 136c. The retry read voltage sets RSb1~RSbn in the sub-read table 136b and the retry read voltage sets RSc1~RScm in the sub-read table 136c are used in the read retry process.

FIG. 2 is a flowchart illustrating a method of reading the conventional solid state storage device. When the control circuit 130 receives a read command from the host 150, the control circuit 130 starts the read process. Firstly, the control circuit 130 performs a normal read process (Step S210). For performing the normal read process, the default read voltage set RSd in the sub-read table 136a is provided to the non-volatile memory 110 by the control circuit 130. According to the default read voltage set RSd, the data in a specified read block of the non-volatile memory 110 is read and corrected. If the ECC circuit 134 is able to correct the error bits of the read data, the accurate read data can be transmitted to the host 150 by the control circuit 130. Meanwhile, the control circuit 130 confirms that the read action is successful (Step S212). Whereas, if the ECC circuit 134 is unable to correct the error bits of the read data, the control circuit 130 confirms that the read action is not successful (Step S212) and the control circuit 130 enters a normal read retry process.

During the normal read retry process, the control circuit 130 performs a read level shift decoding process (Step S220), a read level calibration process (Step S230), a RAID recovery process (Step S240) and a soft decoding process (Step S250) sequentially.

Please refer to FIG. 2 again. If the read action in any of the read level shift decoding process (Step S220), the read level calibration process (Step S230), the RAID recovery process (Step S240) and the soft decoding process (Step S250) in the normal read retry process is successful, the control circuit 130 does not perform the subsequent process. In addition, the accurate read data is transmitted to the host 150 by the control circuit 130. Whereas, if the read actions in all of the step S220, S230, S240 and S250 are not successful, the control circuit 130 sends a read fail message to the host 150 (Step S260). The step S220, S230, S240 and S250 will be described in more details as follows.

FIG. 3A is a flowchart illustrating the read level shift decoding process as shown in FIG. 2. During the read level shift decoding process (Step S220), the retry read voltage sets RSb1~RSbn in the sub-read table 136b of the read table 136 are sequentially provided to the non-volatile memory 110 by the control circuit 130.

Firstly, set x=1 (Step S320). Then, the retry read voltage set RSbx is provided to the non-volatile memory 110 (Step S321). After the retry read voltage set RSbx is provided to the non-volatile memory 110, the ECC circuit 134 of the control circuit 130 corrects the error bits of the read data from the non-volatile memory 110 through a hard decoding method. If the ECC circuit 134 is able to correct the error bits of the read data, the accurate read data is acquired (Step S322). Meanwhile, the control circuit 130 confirms that the read action is successful (Step S325).

Whereas, if the accurate read data is not obtained in the step S322, the control circuit 130 judges whether x=n (Step S323). If x is not equal to n, x is added by 1 (Step S324) and the step S321 is repeatedly done. If x is equal to n, it means that the accurate read data cannot be acquired according to the last retry read voltage set RSbn. Consequently, the control circuit 130 confirms that the read action is not successful (Step S326).

As mentioned above, n retry read voltage sets RSb1~RSbn are recorded in the sub-read table 136b of the read table 136. If the control circuit 130 is able to acquire the accurate read data according to one of the n retry read voltage sets RSb1~RSbn, it means that the read action is successful (Step S325). Whereas, if the control circuit 130 is unable to acquire the accurate read data according to all of the n retry read voltage sets RSb1~RSbn, it means that the read action is not successful (Step S326).

After the control circuit 130 confirms that the read action is not successful (Step S326), the control circuit 130 performs a next step of the normal read retry process, i.e., the read level calibration process (Step S230) of FIG. 2.

FIG. 3B is a flowchart illustrating the read level calibration process as shown in FIG. 2. During the read level calibration process (Step S230), the control circuit 130 selects a retry read voltage set RSby as an initial voltage set (Step S330). Then, the retry read voltage set RSby is calibrated as the optimized retry read voltage set RSby' (Step S331). Generally, after the read voltages Vra~Vrg of the retry read voltage set RSby are finely tuned in the calibration process, the optimized retry read voltage set RSby' is obtained.

Then, the optimized retry read voltage set RSby' is provided to the non-volatile memory 110 by the control circuit 130 (Step S332). Then, the ECC circuit 134 of the control circuit 130 corrects the error bits of the read data from the non-volatile memory 110. If the ECC circuit 134 is able to correct the error bits of the read data, the accurate read data is acquired (Step S333). Meanwhile, the control circuit 130 confirms that the read action is successful (Step S334). Whereas, if the ECC circuit 134 is unable to correct the error bits of the read data, the accurate read data is not acquired (Step S333). Meanwhile, the control circuit 130 confirms that the read action is not successful (Step S335).

After the control circuit 130 confirms that the read action is not successful (Step S335), the control circuit 130 performs a next step of the normal read retry process, i.e., the RAID recovery process (Step S240) of FIG. 2.

FIG. 3C is a flowchart illustrating the RAID recovery process as shown in FIG. 2. During the RAID recovery process (Step S240), the control circuit 130 performs a RAID recovery operation according to the parity data (Step S340). For example, in the normal read process (Step S210), the control circuit 130 acquires the sub-write data from the dies 111~125 of the non-volatile memory 110. If one of the sub-write data from the dies 111~125 is not successfully decoded by the ECC circuit 134, the control circuit 130 confirms that the read action is not successful (Step S212) and the control circuit 130 enters a normal read retry process.

For example, the sub-write data from the die 111 cannot be successfully decoded by the ECC circuit 134 when the RAID recovery process (Step S240) starts. Meanwhile, the control circuit 130 performs the RAID recovery operation on the sub-write data of the other dies 112~125 and the parity data of the die 126 (Step S340) to recover the read data of the die 111. If the read data is successfully recovered, the accurate read data is acquired (Step S341). Meanwhile, the control circuit 130 confirms that the read action is successful (Step S342). Whereas, if the read data is not successfully recovered, the accurate read data is not acquired (Step S341). Meanwhile, the control circuit 130 confirms that the read action is not successful (Step S343).

After the control circuit 130 confirms that the read action is not successful (Step S343), the control circuit 130 performs a next step of the normal read retry process, i.e., the soft decoding process (Step S250) of FIG. 2.

FIG. 3D is a flowchart illustrating the soft decoding process as shown in FIG. 2. During the soft decoding process (Step S250), the retry read voltage sets RSc1~RScm in the sub-read table 136c of the read table 136 are sequentially provided to the non-volatile memory 110 by the control circuit 130.

Firstly, set x=1 (Step S350). Then, the retry read voltage set RScx is provided to the non-volatile memory 110 to acquire the hard information and the soft information (Step S351). For example, after the hard information and the soft information are generated according to the retry read voltage set RScx, the hard information and the soft information are transmitted from the non-volatile memory 110 to the ECC circuit 134. While the ECC circuit 134 performs a soft decoding process, an iterative operation is done according to the hard information and the soft information. If the soft decoding action of the ECC circuit 134 is able to correct the error bits of the read data according to the default read voltage set RSd in the normal read process (Step S210), the accurate read data is acquired (Step S352). Meanwhile, the control circuit 130 confirms that the read action is successful (Step S355).

Whereas, if the accurate read data is not obtained in the step S352, the control circuit 130 judges whether x=m (Step S353). If x is not equal to m, x is added by 1 (Step S354) and the step S351 is repeatedly done. If x is equal to m, it means that the accurate read data cannot be acquired according to the hard information and the soft information corresponding to the last retry read voltage set RScm. Consequently, the control circuit 130 confirms that the read action is not successful (Step S356).

As mentioned in FIG. 2, the control circuit 130 has to sequentially perform the read level shift decoding process (Step S220), the read level calibration process (Step S230), the RAID recovery process (Step S240) and the soft decoding process (Step S250) after the conventional solid state storage device 10 enters the read retry process. Moreover, the sub-read table 136b is applied to the read level shift decoding process (Step S220) and the read level calibration process (Step S230), and the sub-read table 136c is applied to the soft decoding process (Step S250).

Obviously, the read method of the conventional solid state storage device 10 has some drawbacks. For example, since the control circuit 130 has to perform so many steps in the read retry process, it takes a long time period to acquire the accurate read data. Under this circumstance, the latency time of reading the conventional solid state storage device 10 is largely increased. Moreover, in the read retry process of the solid state storage device 10, the long reading time period (i.e., time out) results in the unsuccessful read action.

SUMMARY OF THE INVENTION

An embodiment of the present invention provides a read retry method for a solid state storage device. The solid state storage device is in communication with a host. The solid state storage device includes a non-volatile memory. The read retry method includes the following steps. Firstly, the solid state storage device judges whether a specified read block of the non-volatile memory is in a specified failure mode. If the specified read block of the non-volatile memory is in the specified failure mode, a failure mode read retry process corresponding to the specified failure mode is performed. If an accurate read data is acquired in the failure mode read retry process, the accurate read data is transmitted to the host. If the accurate read data is not acquired in the failure mode read retry process, a read fail message is sent to the host.

Another embodiment of the present invention provides a read retry method for a solid state storage device. The solid state storage device is in communication with a host. The solid state storage device includes a non-volatile memory. The read retry method includes the following steps. Firstly, the solid state storage device judges whether a specified read block of the non-volatile memory is in a specified failure mode. If the specified read block of the non-volatile memory is in the specified failure mode, a RAID recovery process is performed. If an accurate read data is acquired in the RAID recovery process, the accurate read data is transmitted to the host. If the accurate read data is not acquired in the RAID recovery process, a read fail message is sent to the host.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 1D (prior art) schematically illustrates the contents of a read table in the conventional solid state storage device;

FIG. 4A is a schematic functional block diagram illustrating the architecture of a solid state storage device according to an embodiment of the present invention;

FIG. 4B schematically illustrates the contents of a read table in the solid state storage device according to the embodiment of the present invention;

DETAILED DESCRIPTION OF PREFERRED EMBODIMENTS

Figure 1A:
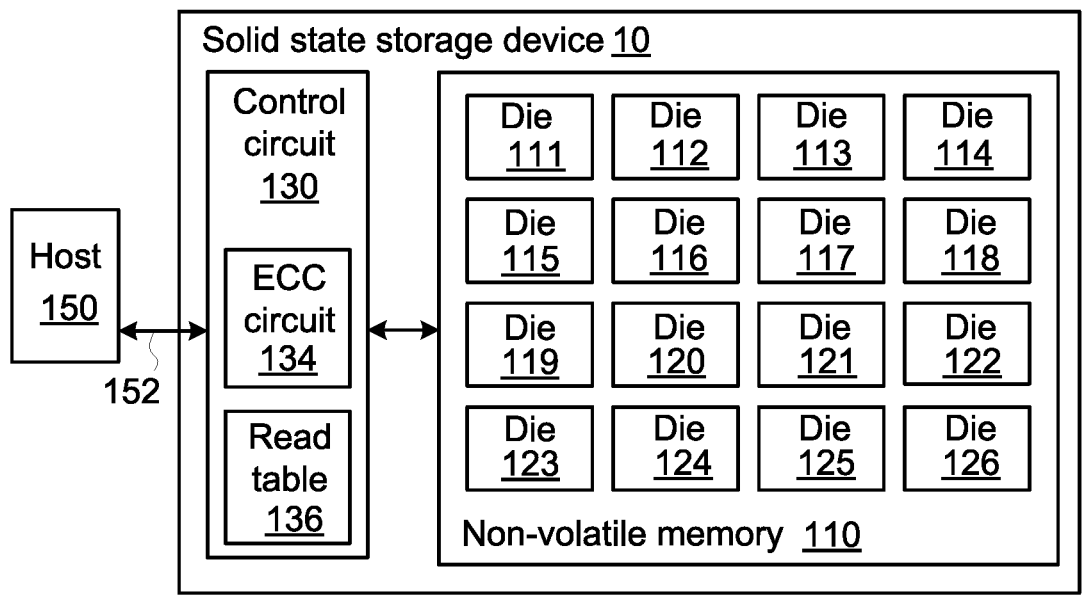
FIG. 1A (prior art) is a schematic functional block diagram illustrating the architecture of a conventional solid state storage device.
Figure 1B:
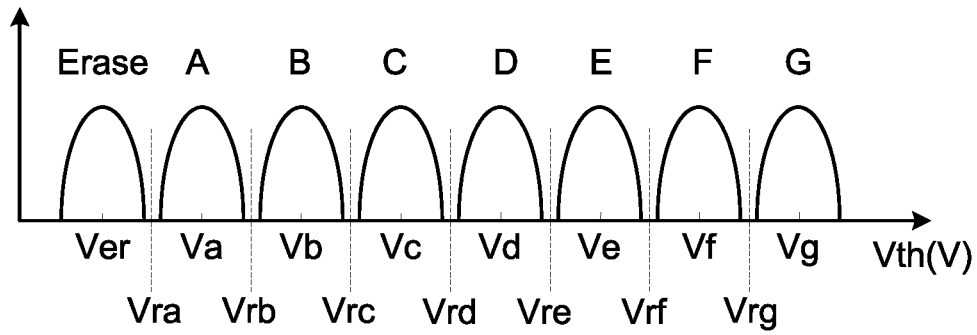
FIG. 1B (prior art) schematically illustrates the threshold voltage distribution curves of triple-level cells in different storing states.
Figure 1C:
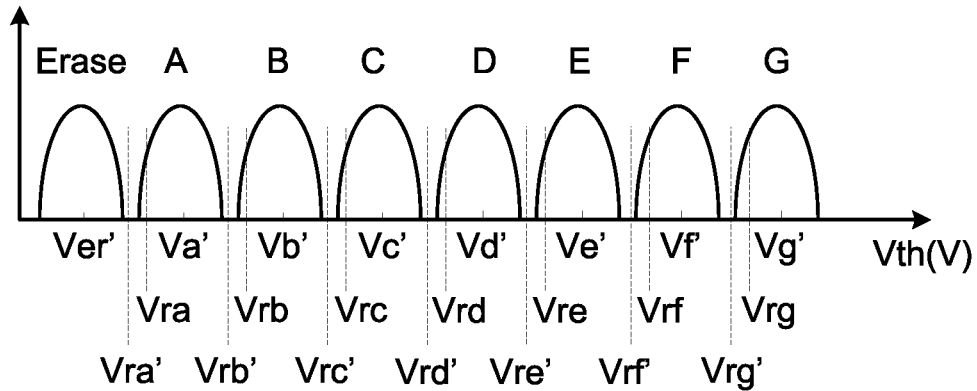
FIG. 1C (prior art) schematically illustrates the shift of the threshold voltage distribution curves of triple-level cells in different storing states.

The present invention provides a read retry method for a solid state storage device. According to the characteristics of the non-volatile memory of the solid state storage device, the read retry process is properly adjusted. Consequently, the time period of performing the read retry process is effectively reduced, and the time-out problem is avoided.

FIG. 4A is a schematic functional block diagram illustrating the architecture of a solid state storage device according to an embodiment of the present invention. As shown in FIG. 4A, the solid state storage device 40 comprises a control circuit 430 and a non-volatile memory 110. The non-volatile memory 110 comprises plural dies 111~126. The plural dies 111~126 are combined as a redundant array of independent disk (RAID).

The control circuit 430 comprises an ECC circuit 134 and a failure mode judgement module 406. The solid state storage device 40 further comprises a read table 436. As shown in FIG. 4A, the read table 436 is included in the control circuit 430. In some situations, the read table 436 is included in the non-volatile memory 110.

Moreover, the control circuit 430 is connected with the non-volatile memory 110. According to a write command from the host 150, the control circuit 430 stores the write data from the host 150 to the non-volatile memory 110. Alternatively, according to a read command from the host 150, the control circuit 430 acquires a read data from the non-volatile memory 110. In addition, the read data is transmitted to the host 150 through the control circuit 430.

The failure mode judgement module 406 of the control circuit 430 is used for judging the failure mode of a specified read block of the non-volatile memory 110. According to the failure mode, the control circuit 430 properly adjusts the read retry process and provides a corresponding failure mode read retry process. Consequently, the time period of performing the read retry process is effectively reduced, and the time-out problem is avoided. For example, the failure mode includes a program failure mode, a write/read temperature difference failure mode, a read disturbing failure mode or a data retention failure mode.

FIG. 4B schematically illustrates the contents of a read table in the solid state storage device according to the embodiment of the present invention. As shown in FIG. 4B, the read table 436 contains three sub-read tables 436a, 436b and 436c. A default read voltage set RSd is recorded in the sub-read table 436a, n retry read voltage sets RSb1~RSbn are recorded in the sub-read table 436b, and m retry read voltage sets RSc1~RScm are recorded in the sub-read table 436c.

In an embodiment, the n retry read voltage sets RSb1~RSbn in the sub-read table 436b are applied to the corresponding failure modes F1~F3. In FIG. 4B, F1 denotes the write/read temperature difference failure mode, F2 denotes the read disturbing failure mode, and F3 denotes the data retention failure mode. In the sub-read table 436b, k1 retry read voltage sets RSb1 RSb3, RSb6, RSb9, . . . are applied to the write/read temperature difference failure mode (F1), k2 retry read voltage sets RSb2, RSb5, RSb6, . . . are applied to the read disturbing failure mode (F2), and k3 retry read voltage sets RSb3, RSb8, RSbn, . . . are applied to the data retention failure mode (F3). Moreover, k1≤n, k2≤n, and k3≤n.

In this embodiment, the retry read voltage sets corresponding to each failure mode are some specified retry read voltage sets from the sub-read table 436b. Moreover, the sequence of the retry read voltage sets in the sub-read table 436b and corresponding to each of the failure modes F1~F3 is not restricted. That is, after some specified retry read voltage sets are taken from the sub-read table 436b, these specified retry read voltage sets are rearranged and used as the retry read voltage sets for the corresponding failure mode.

When the control circuit 430 is in the normal working state, the failure mode judgement module 406 judges the failure mode of the specified read block in the non-volatile memory 110 according to the read/write condition of the specified read block. Moreover, the control circuit 430 can set the failure mode read retry process corresponding to at least one failure mode.

Figure 4C:
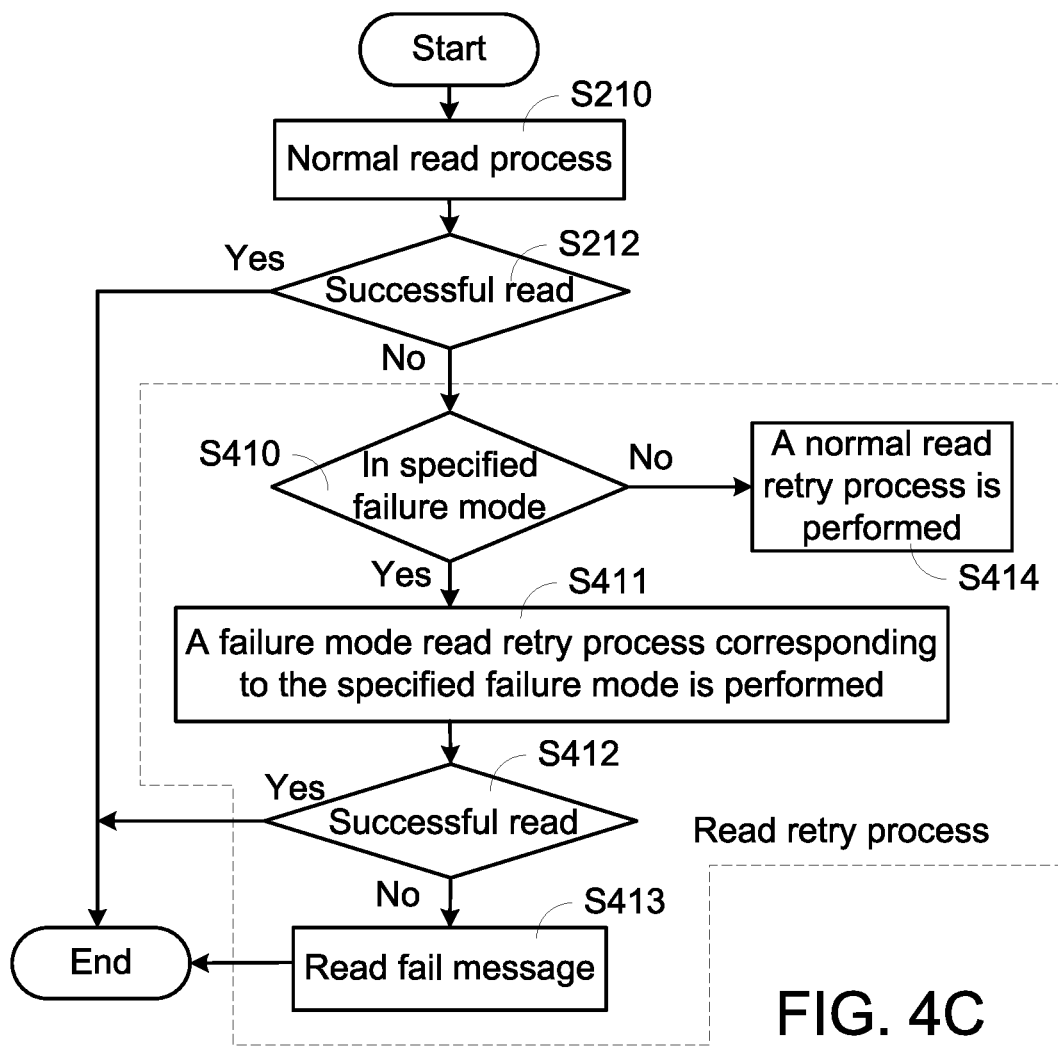
FIG. 4C is a flowchart illustrating a method of reading the solid state storage device according to the embodiment of the present invention.

After the control circuit 430 enters the read retry process, the control circuit 430 judges the failure mode of the specified read block in the non-volatile memory 110 and determines whether to perform the failure mode read retry process corresponding to the failure mode. FIG. 4C is a flowchart illustrating a method of reading the solid state storage device according to the embodiment of the present invention.

Firstly, according to a read command from the host 150, the control circuit 430 performs a normal read process (Step S210). For performing the normal read process, the default read voltage set RSd in the sub-read table 436a is provided to the non-volatile memory 110 by the control circuit 430. According to the default read voltage set RSd, the data in a specified read block of the non-volatile memory 110 is read and corrected. If the ECC circuit 134 is able to correct the error bits of the read data, the accurate read data can be transmitted to the host 150 by the control circuit 430. Meanwhile, the control circuit 430 confirms that the read action is successful (Step S212). Whereas, if the ECC circuit 134 is unable to correct the error bits of the read data, the control circuit 430 confirms that the read action is not successful (Step S212) and the control circuit 430 enters a read retry process.

After the control circuit 430 enters the read retry process, the control circuit 430 judges the failure mode of the specified read block in the non-volatile memory 110. If the specified read block is in a specified failure mode (Step S410), the control circuit 430 performs a failure mode read retry process corresponding to the specified failure mode (Step S411). For example, the specified failure mode includes a program failure mode, a write/read temperature difference failure mode, a read disturbing failure mode or a data retention failure mode.

For example, if the control circuit 430 judges that the specified read block is in the program failure mode, the control circuit 430 performs a failure mode read retry process corresponding to the program failure mode. Similarly, if the control circuit 430 judges that the specified read block is in the write/read temperature difference failure mode, the control circuit 430 performs a failure mode read retry process corresponding to the write/read temperature difference failure mode. Similarly, if the control circuit 430 judges that the specified read block is in the read disturbing failure mode, the control circuit 430 performs a failure mode read retry process corresponding to the read disturbing failure mode. Similarly, if the control circuit 430 judges that the specified read block is in the data retention failure mode, the control circuit 430 performs a failure mode read retry process corresponding to the data retention failure mode.

After the failure mode read retry process corresponding to the specified failure mode is completed in the step S411, the control circuit 430 judges whether the accurate read data is acquired (Step S412). If the result of the step S412 indicates that the accurate read data is acquired, the control circuit 430 confirms that the read action is successful and the accurate read data is transferred to the host 150. Whereas, if the result of the step S412 indicates that the accurate read data is not acquired, the control circuit 430 confirms that the read action is not successful. Meanwhile, the control circuit 430 sends a read fail message to the host 150 (Step S413).

Figure 2:
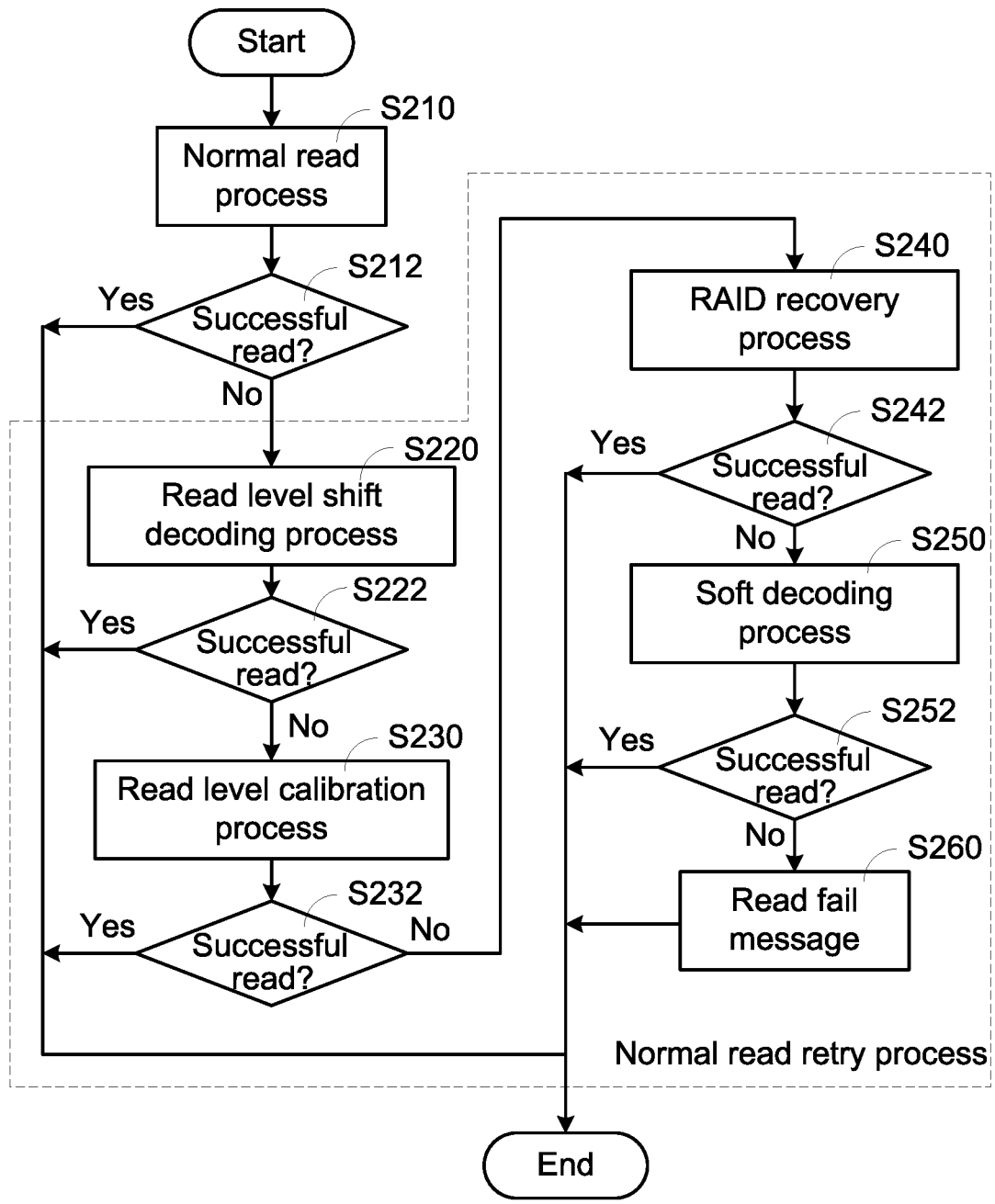
FIG. 2 (prior art) is a flowchart illustrating a method of reading the conventional solid state storage device.
Figure 3A:
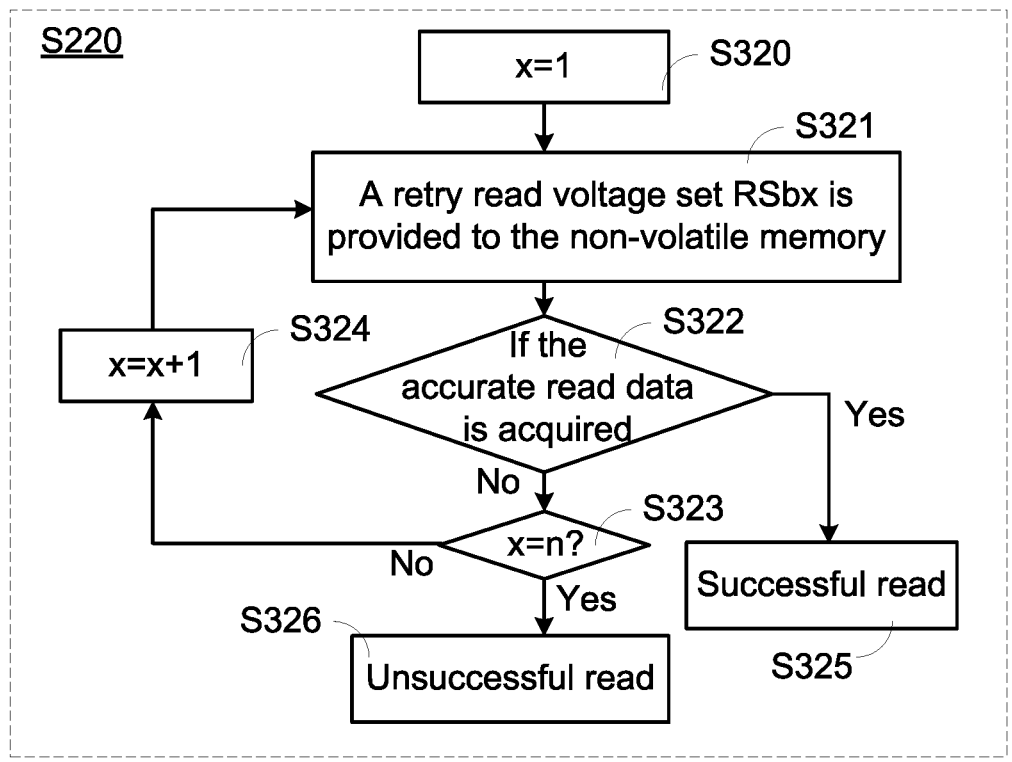
FIG. 3A (prior art) is a flowchart illustrating the read level shift decoding process as shown in FIG. 2.
Figure 3B:
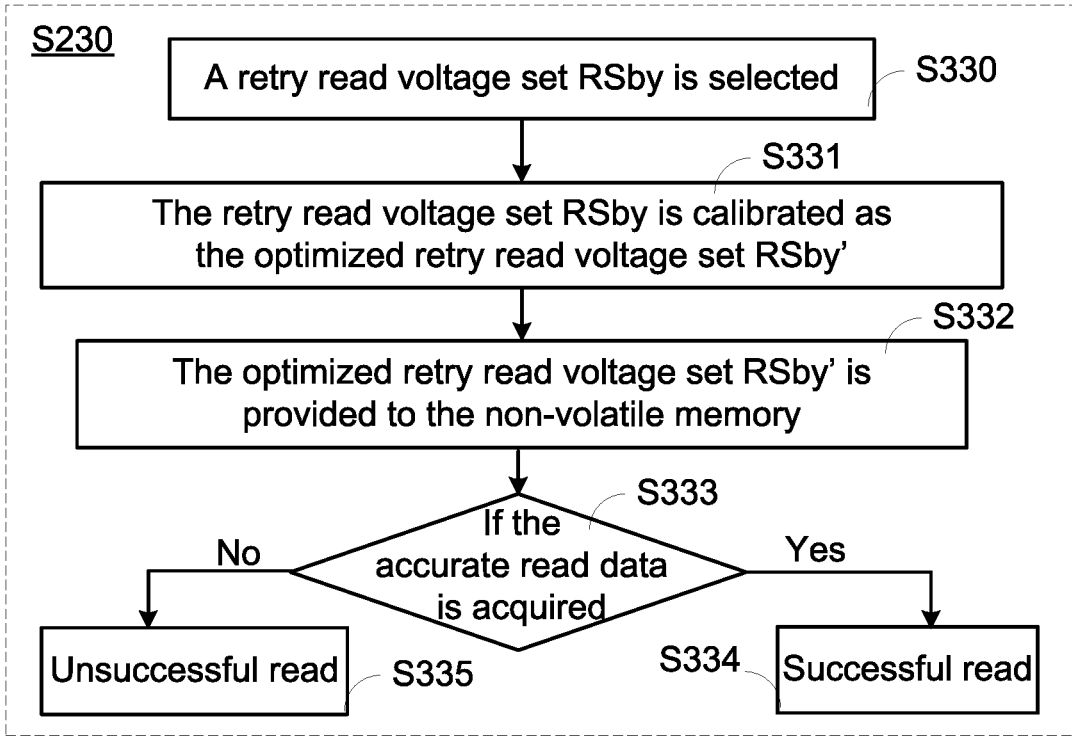
FIG. 3B (prior art) is a flowchart illustrating the read level calibration process as shown in FIG. 2.
Figure 3C:
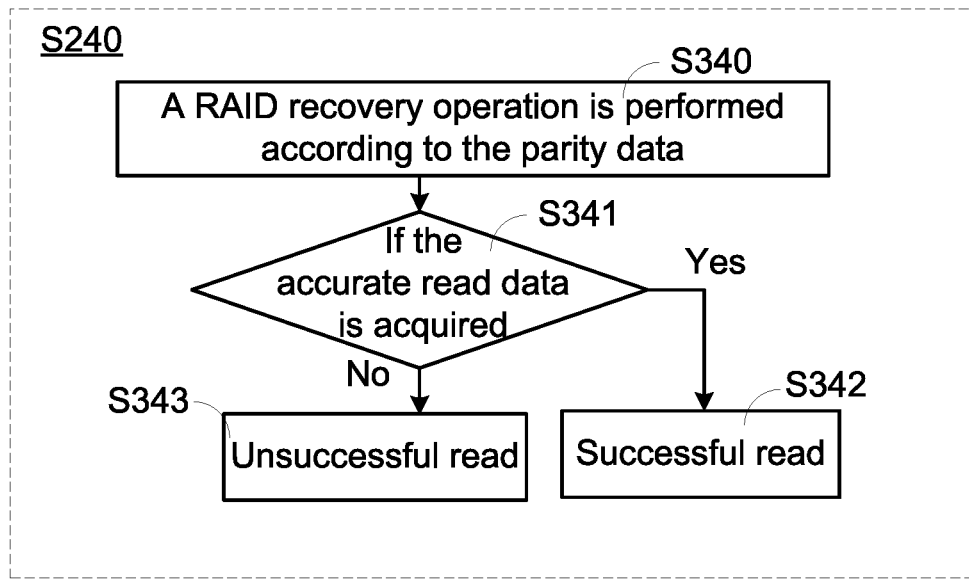
FIG. 3C (prior art) is a flowchart illustrating the RAID recovery process as shown in FIG. 2.
Figure 3D:
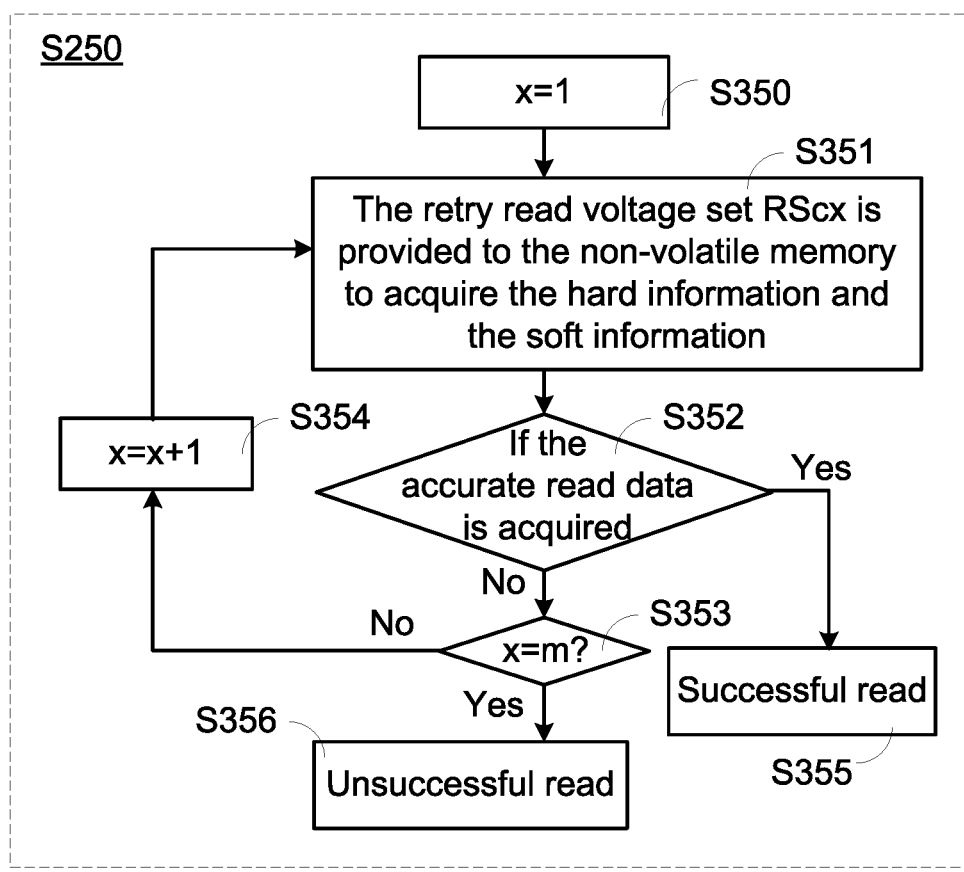
FIG. 3D (prior art) is a flowchart illustrating the soft decoding process as shown in FIG. 2.

Whereas, if the specified read block is not in the specified failure mode (Step S410), the control circuit 430 performs a normal read retry process (Step S414). Likewise, the normal read retry process includes the steps S220~S260 as shown in FIG. 2. That is, if the control circuit 430 judges that the specified read block is not in any of the program failure mode, the write/read temperature difference failure mode, the read disturbing failure mode and the data retention failure mode, the control circuit 430 performs the normal read retry process (Step S414).

As mentioned above, if the accurate read data is not acquired after the failure mode read retry process corresponding to the specified failure mode is completed, the control circuit 430 sends the read fail message to the host 150 and the flowchart is ended.

In some embodiments, the control circuit 430 can perform plural failure mode read retry processes corresponding to plural failure modes. Moreover, the failure mode judgement module 406 of the control circuit 430 judges the plural failure modes according to a predetermined sequence. For example, the failure mode judgement module 406 judges the program failure mode, the write/read temperature difference failure mode, the read disturbing failure mode and the data retention failure mode sequentially.

Figure 5:
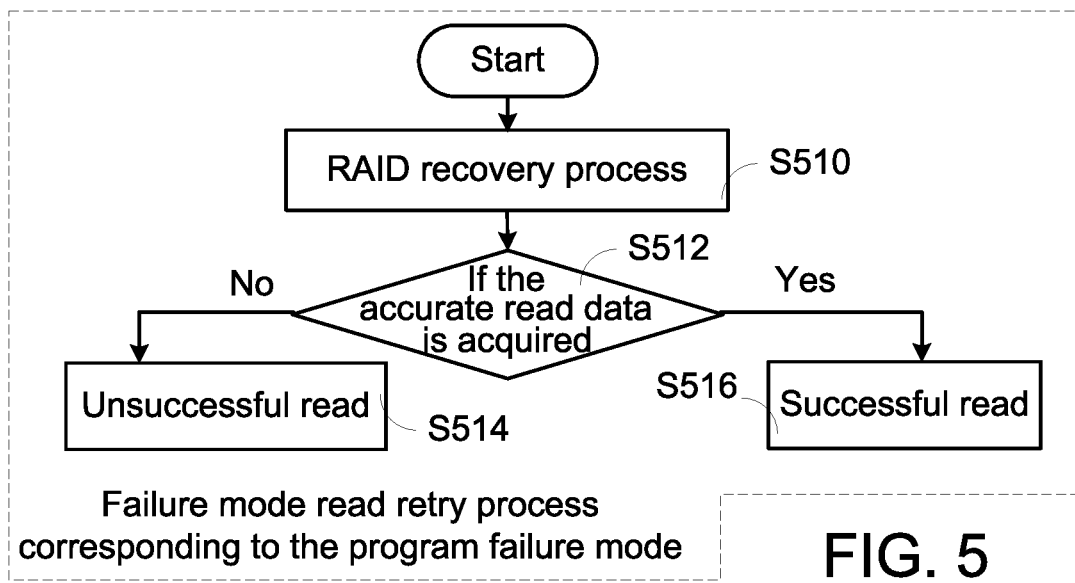
FIG. 5 is a flowchart illustrating a failure mode read retry process corresponding to a program failure mode.

FIG. 5 is a flowchart illustrating a failure mode read retry process corresponding to a program failure mode. If the control circuit 430 judges that the specified read block of the non-volatile memory 110 is in the program failure mode, the control circuit 430 performs a failure mode read retry process corresponding to the program failure mode. Then, the control circuit 430 performs a RAID recovery process (Step S510). That is, the failure mode read retry process corresponding to the program failure mode is the RAID recovery process. After the RAID recovery process is completed, the control circuit 430 judges whether the accurate read data is acquired (Step S512). If the result of the step S512 indicates that the accurate read data is acquired, the control circuit 430 confirms that the read action is successful (Step S516). Whereas, if the result of the step S512 indicates that the accurate read data is not acquired, the control circuit 430 confirms that the read action is not successful (Step S514).

During the RAID recovery process (Step S510), the control circuit 430 performs a RAID recovery operation according to the parity data. For example, the sub-write data from the die 111 cannot be successfully decoded by the ECC circuit 134. Meanwhile, the control circuit 430 performs the RAID recovery operation on the sub-write data of the other dies 112~125 and the parity data of the die 126 to recover the read data of the die 111. If the read data is successfully recovered, the accurate read data is acquired (Step S512). Meanwhile, the control circuit 430 confirms that the read action is successful (Step S516). Whereas, if the read data is not successfully recovered, the accurate read data is not acquired (Step S512). Meanwhile, the control circuit 430 confirms that the read action is not successful (Step S514).

Figure 6:
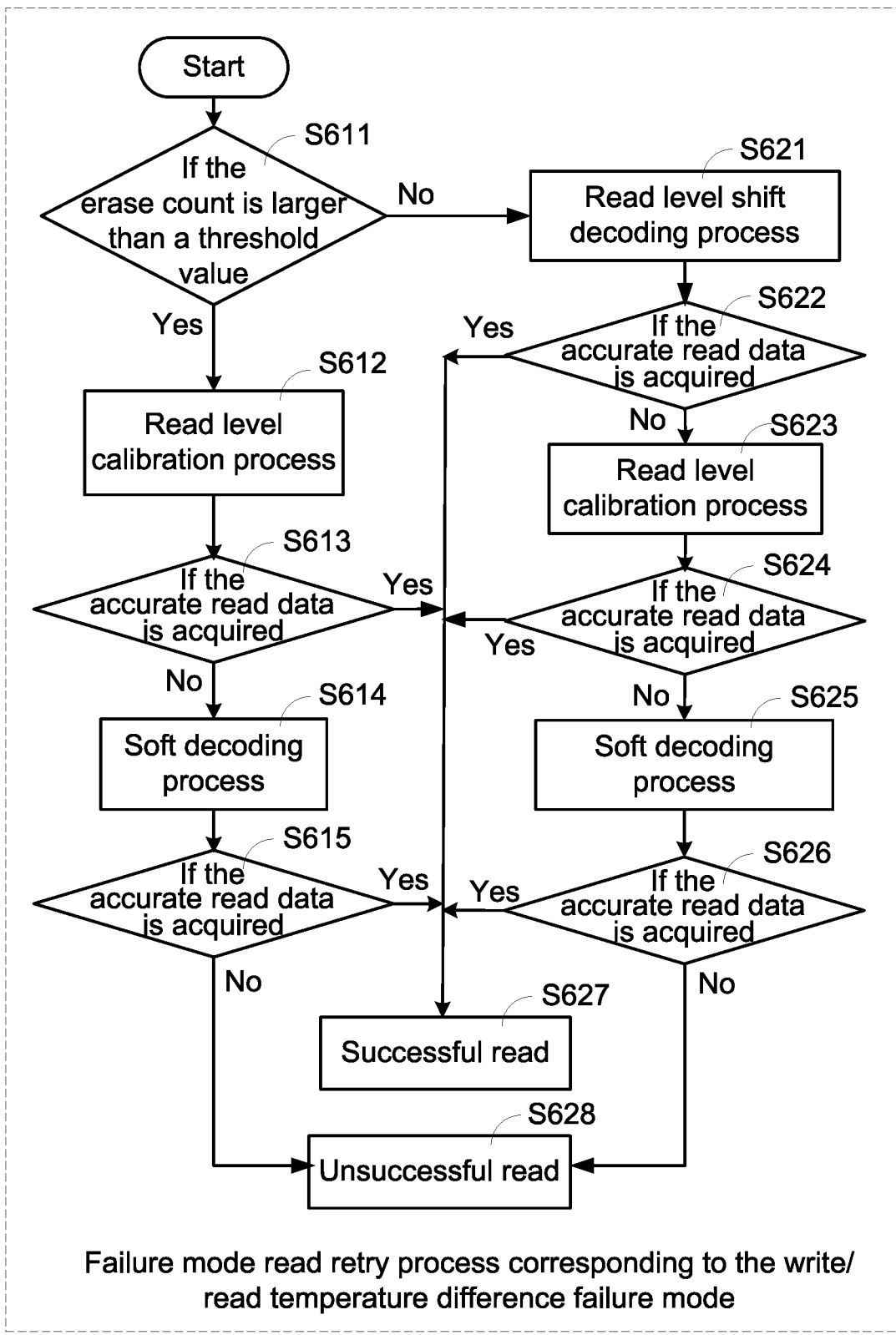
FIG. 6 is a flowchart illustrating a failure mode read retry process corresponding to a write/read temperature difference failure mode.

FIG. 6 is a flowchart illustrating a failure mode read retry process corresponding to a write/read temperature difference failure mode. If the control circuit 430 judges that the specified read block of the non-volatile memory 110 is in the write/read temperature difference failure mode, the control circuit 430 performs a failure mode read retry process corresponding to the write/read temperature difference failure mode. Then, the control circuit 430 decides the subsequent process to be performed according to an erase count of the specified read block. Generally, if the erase count of the specified read block is larger, it means that the characteristics of the memory cells in the specified read block are impaired. Whereas, if the erase count of the specified read block is smaller, it means that the characteristics of the memory cells in the specified read block are still acceptable.

If the erase count of the specified read block is not larger than a threshold value (Step S611), the control circuit 430 performs a read level shift decoding process (Step S621). During the read level shift decoding process (Step S621), the retry read voltage sets in the sub-read table 136b of the read table 136 and corresponding to the write/read temperature difference failure mode are sequentially provided to the non-volatile memory 110 by the control circuit 430.

For example, the sub-read table 436b of the read table 436 has k1 retry read voltage sets corresponding to the write/read temperature difference failure mode (F1). If the ECC circuit 134 of the control circuit 430 is able to correct the error bits of the read data from the non-volatile memory 110 through a hard decoding method according to any retry read voltage set of the k1 retry read voltage sets, the control circuit 430 acquires the accurate read data (Step S622) and confirms that the read action is successful (Step S627). Whereas, if the control circuit 430 is unable to acquire the accurate read data according to all of the k1 retry read voltage sets (Step S622), it means that the read action is not successful. Then, the control circuit 430 performs a read level calibration process (Step S623).

During the read level calibration process (Step S623), a retry read voltage set is selected from the k1 retry read voltage sets corresponding to the write/read temperature difference failure mode (F1) and used as an initial voltage set by the control circuit 430. After the initial voltage set is calibrated as the optimized retry read voltage set by the control circuit 430, the optimized retry read voltage set is provided to the non-volatile memory 110. Then, the ECC circuit 134 of the control circuit 430 corrects the error bits of the read data from the non-volatile memory 110. If the ECC circuit 134 is able to correct the error bits of the read data, the accurate read data is acquired (Step S624). Meanwhile, the control circuit 430 confirms that the read action is successful (Step S627). Whereas, if the ECC circuit 134 is unable to correct the error bits of the read data, the accurate read data is not acquired (Step S624). Then, the control circuit 430 performs a soft decoding process (Step S625).

During the soft decoding process (Step S625), the retry read voltage sets RSc1~RScm in the sub-read table 436c of the read table 436 are sequentially provided to the non-volatile memory 110 by the control circuit 430. Then, the control circuit 430 provides the retry read voltage set RScx to the non-volatile memory 110 to acquire the hard information and the soft information. If the soft decoding action of the ECC circuit 134 is able to correct the error bits of the read data according to any of the hard information and the soft information, the accurate read data is acquired (Step S626). Meanwhile, the control circuit 430 confirms that the read action is successful (Step S627). Whereas, if the control circuit 430 is unable to acquire the accurate read data (Step S626), the control circuit 430 confirms that the read action is not successful (Step S628).

If the erase count of the specified read block is larger than the threshold value in the step S611, the control circuit 430 performs a read level calibration process (Step S612) and a soft decoding process (Step S614) sequentially. The steps S612~S615 are similar to the steps S623~S626, and are not redundantly described herein.

As mentioned above, in case that the specified read block of the non-volatile memory 110 is in the write/read temperature difference failure mode, the control circuit 430 selectively performs the subsequent processes according to the erase count of the specified read block.

Figure 7:
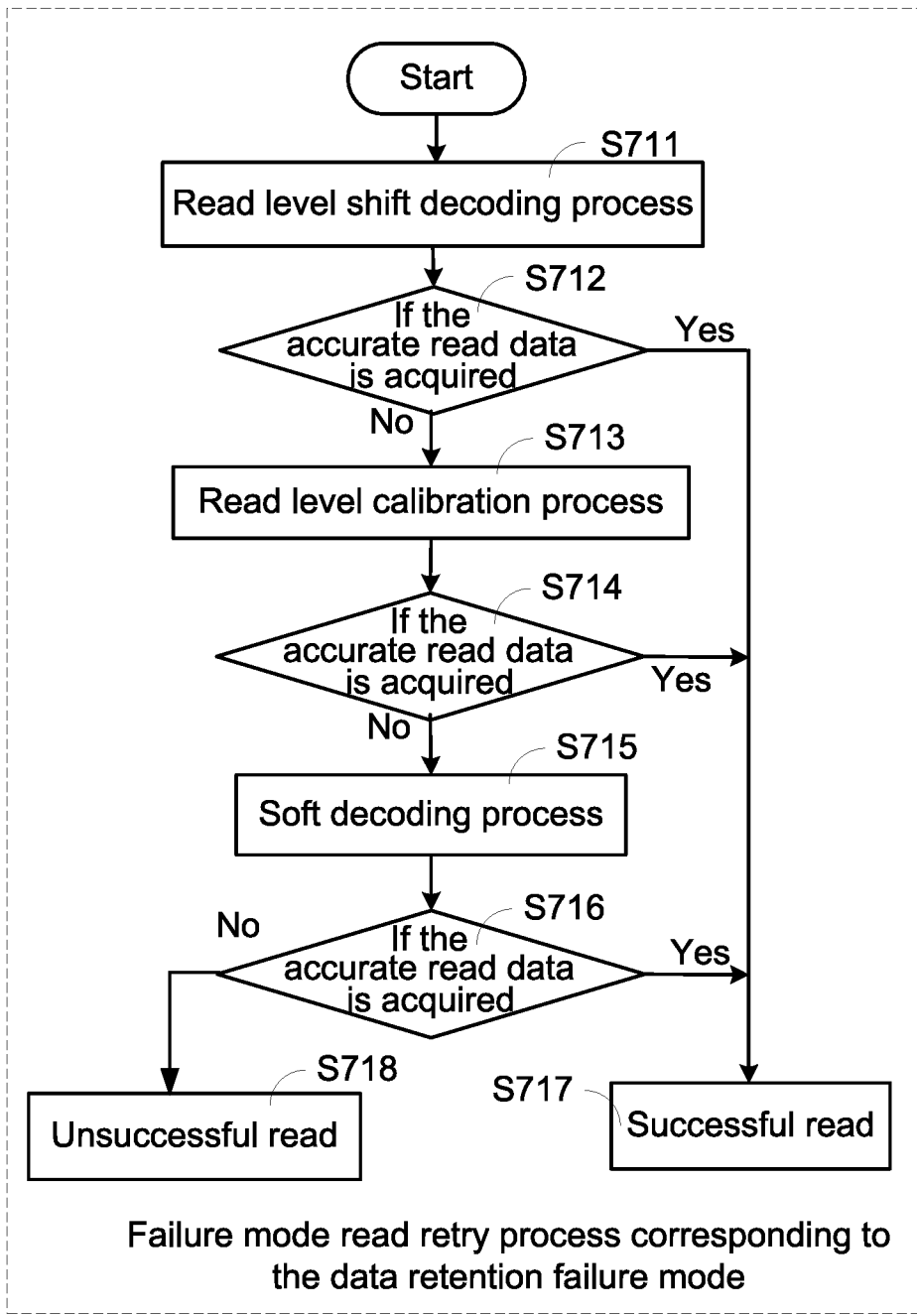
FIG. 7 is a flowchart illustrating a failure mode read retry process corresponding to a data retention failure mode.

FIG. 7 is a flowchart illustrating a failure mode read retry process corresponding to a data retention failure mode. If the control circuit 430 judges that the specified read block of the non-volatile memory 110 is in the data retention failure mode, the control circuit 430 performs a failure mode read retry process corresponding to the data retention failure mode. For performing the failure mode read retry process corresponding to the data retention failure mode, the control circuit 430 performs a read level shift decoding process (Step S711), a read level calibration process (Step S713) and a soft decoding process (Step S715) sequentially.

During the read level shift decoding process (Step S711), the retry read voltage sets in the sub-read table 136b of the read table 136 and corresponding to the data retention failure mode are sequentially provided to the non-volatile memory 110 by the control circuit 430.

For example, the sub-read table 436b of the read table 436 has k3 retry read voltage sets corresponding to the data retention failure mode (F3). If the ECC circuit 134 of the control circuit 430 is able to correct the error bits of the read data from the non-volatile memory 110 through a hard decoding method according to any retry read voltage set of the k3 retry read voltage sets, the control circuit 430 acquires the accurate read data (Step S712) and confirms that the read action is successful (Step S717). Whereas, if the control circuit 430 is unable to acquire the accurate read data according to all of the k3 retry read voltage sets (Step S712), it means that the read action is not successful. Then, the control circuit 430 performs a read level calibration process (Step S713).

During the read level calibration process (Step S713), a retry read voltage set is selected from the k3 retry read voltage sets and used as an initial voltage set by the control circuit 430. After the initial voltage set is calibrated as the optimized retry read voltage set by the control circuit 430, the optimized retry read voltage set is provided to the non-volatile memory 110. If the ECC circuit 134 is able to correct the error bits of the read data, the accurate read data is acquired (Step S714). Meanwhile, the control circuit 430 confirms that the read action is successful (Step S717). Whereas, if the ECC circuit 134 is unable to correct the error bits of the read data, the accurate read data is not acquired (Step S714). Then, the control circuit 430 performs the soft decoding process (Step S715). The steps S715~S718 are similar to the steps S625~S628 as shown in FIG. 6, and are not redundantly described herein.

Figure 8:
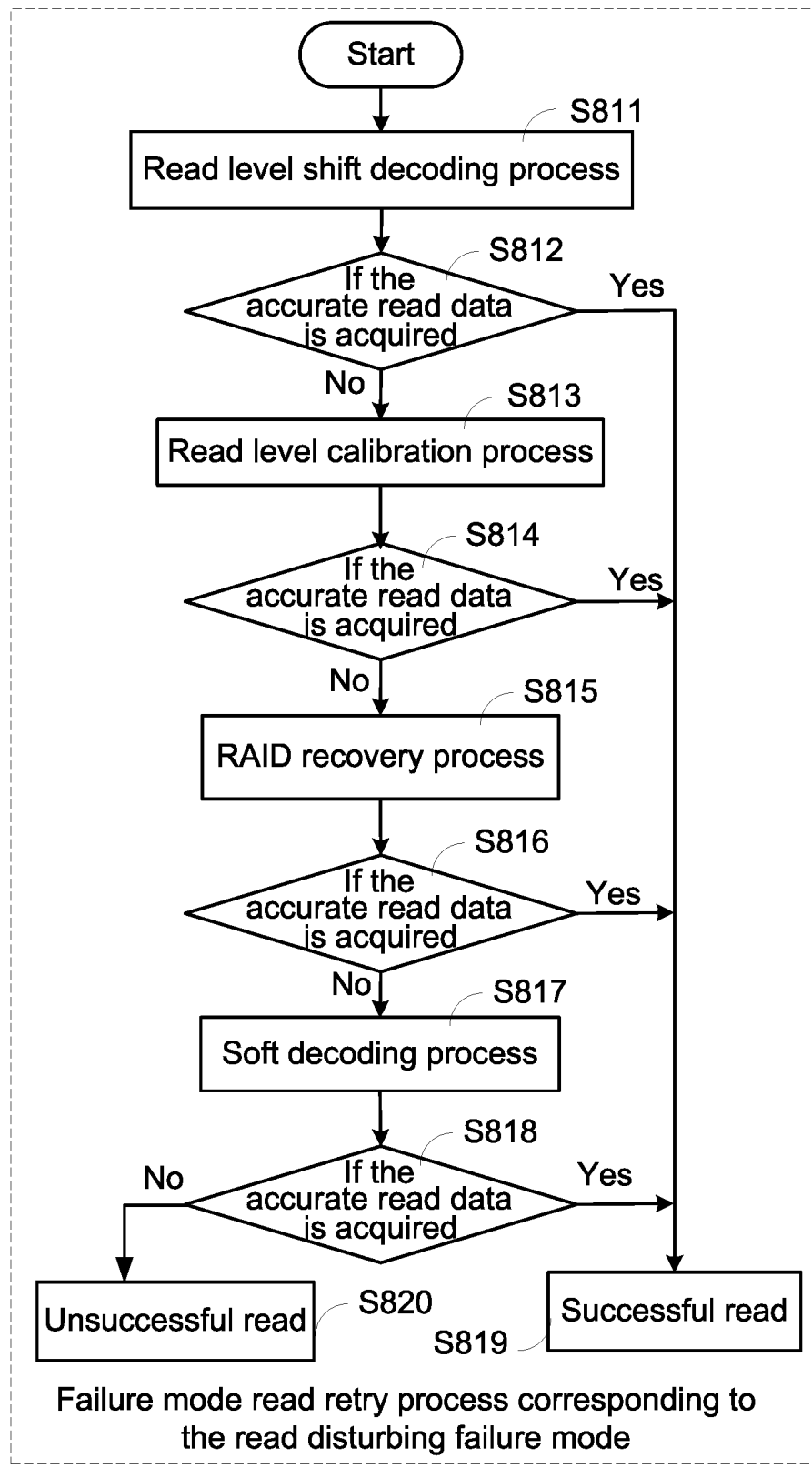
FIG. 8 is a flowchart illustrating a failure mode read retry process corresponding to a read disturbing failure mode.

FIG. 8 is a flowchart illustrating a failure mode read retry process corresponding to a read disturbing failure mode. If the control circuit 430 judges that the specified read block of the non-volatile memory 110 is in the read disturbing failure mode, the control circuit 430 performs a failure mode read retry process corresponding to the read disturbing failure mode. For performing the failure mode read retry process corresponding to the read disturbing failure mode, the control circuit 430 performs a read level shift decoding process (Step S811), a read level calibration process (Step S813), a RAID recovery process (Step S815) and a soft decoding process (Step S817) sequentially.

During the read level shift decoding process (Step S811), the retry read voltage sets in the sub-read table 136*b* of the read table 136 and corresponding to the read disturbing failure mode are sequentially provided to the non-volatile memory 110 by the control circuit 430.

For example, the sub-read table 436*b* of the read table 436 has k2 retry read voltage sets corresponding to the read disturbing failure mode (F2). If the ECC circuit 134 of the control circuit 430 is able to correct the error bits of the read data from the non-volatile memory 110 through a hard decoding method according to any retry read voltage set of the k2 retry read voltage sets, the control circuit 430 acquires the accurate read data (Step S812) and confirms that the read action is successful (Step S819). Whereas, if the control circuit 430 is unable to acquire the accurate read data according to all of the k2 retry read voltage sets (Step S812), it means that the read action is not successful. Then, the control circuit 430 performs a read level calibration process (Step S813).

During the read level calibration process (Step S813), a retry read voltage set is selected from the k2 retry read voltage sets and used as an initial voltage set by the control circuit 430. After the initial voltage set is calibrated as the optimized retry read voltage set by the control circuit 430, the optimized retry read voltage set is provided to the non-volatile memory 110. If the ECC circuit 134 is able to correct the error bits of the read data, the accurate read data is acquired (Step S814). Meanwhile, the control circuit 430 confirms that the read action is successful (Step S819). Whereas, if the ECC circuit 134 is unable to correct the error bits of the read data, the accurate read data is not acquired (Step S814). Then, the control circuit 430 performs the RAID recovery process (Step S815). The RAID recovery process (Step S815) is similar to the RAID recovery process (Step S510) as shown in FIG. 5, and is not redundantly described herein.

After the RAID recovery process (Step S815) is completed, if the accurate read data is not acquired (Step S816), the control circuit 430 performs the soft decoding process (Step S817). The steps S817~S820 are similar to the steps S625~S628 as shown in FIG. 6, and are not redundantly described herein.

From the above descriptions, the present invention provides a read retry method for a solid state storage device. The solid state storage device can set the failure mode read retry process corresponding to at least one failure mode. According to the failure mode of the specified read block of the non-volatile memory, the read retry process is properly adjusted. Moreover, the retry read voltage sets and/or the sequence of the retry read voltage sets in the sub-read table corresponding to the specified failure mode may be set according to the practical requirements. When compared with the conventional technology, the number of the retry read voltage sets in the sub-read table corresponding to the specified failure mode is reduced and/or the sequence of the retry read voltage sets is adjustable. Consequently, the time period of performing the failure mode read retry process corresponding to the specified failure mode is effectively reduced, and the time-out problem is avoided.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for recovering a solid state storage device from a memory accessing error, wherein the solid state storage device comprises a memory and a control circuit, and the control circuit comprises a failure mode judging circuit, the method comprising steps of:
   judging whether the memory is in one of a first failure mode and a second failure mode by the failure mode judging circuit after the memory accessing error occurs on a specified read block, wherein the first failure mode associates with a first error handling operating sequence, the second failure mode associates with a second error handling operating sequence, and the first error handling operating sequence is different from the second error handling operating sequence; and
   performing the first error handling operating sequence by the control circuit in response to the failure mode judging circuit determining the memory is in the first failure mode;
   wherein the first failure mode is a write/read temperature difference failure mode and the first error handling operating sequence comprises steps of:
   judging an erase count of the specified read block;
   if the erase count is larger than a threshold value, performing a read level calibration process and then, if the read level calibration process is unsuccessful, performing a soft decoding process; and
   if the erase count is not larger than the threshold value, performing a read level shift decoding process, and then, if the read level shift decoding process is unsuccessful, performing the read level calibration process, and then, if the read level shift decoding process and the read level calibration process are both unsuccessful, performing the soft decoding process.

2. The method as claimed in claim 1, wherein the second failure mode is a data retention failure mode and the second error handling operating sequence includes another read level shift decoding process, another read level calibration process, and another soft decoding process.

3. The method as claimed in claim 1, wherein the second failure mode is a read disturbing failure mode and the second error handling operating sequence includes another read level shift decoding process, another read level calibration process, a RAID recovery process, and another soft decoding process.

4. The method as claimed in claim 1, further comprising:
   performing a default error handling operating sequence by the control circuit in response to the failure mode judging circuit determining the memory is not in the first failure mode or in the second failure mode;
   wherein the first error handling operating sequence associates with a first subset of a plurality of predefined sets of read retry voltages, and the default error handling operating sequence associates with the plurality of predefined sets of read retry voltages.

5. The method as claimed in claim 4, wherein the default error handling operating sequence comprises another read level shift decoding process, another read level calibration process, a RAID recovery process, and another soft decoding process.

\* \* \* \* \*